United States Patent
Arai et al.

(10) Patent No.: US 9,569,576 B2
(45) Date of Patent: Feb. 14, 2017

(54) MASK PATTERN GENERATING METHOD, STORAGE MEDIUM, INFORMATION PROCESSING APPARATUS FOR EXECUTION OF THE SAME, MASK MANUFACTURING METHOD AND DEVICE MANUFACTURING METHOD

(71) Applicant: CANON KABUSHIKI KAISHA, Tokyo (JP)

(72) Inventors: Tadashi Arai, Saitama (JP); Yuichi Gyoda, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/416,762

(22) PCT Filed: Sep. 3, 2013

(86) PCT No.: PCT/JP2013/005193
§ 371 (c)(1),
(2) Date: Jan. 23, 2015

(87) PCT Pub. No.: WO2014/038181
PCT Pub. Date: Mar. 13, 2014

(65) Prior Publication Data
US 2015/0213175 A1 Jul. 30, 2015

(30) Foreign Application Priority Data
Sep. 6, 2012 (JP) .................................. 2012-195820

(51) Int. Cl.
G06F 17/50 (2006.01)
G03F 1/70 (2012.01)

(52) U.S. Cl.
CPC ............. *G06F 17/5068* (2013.01); *G03F 1/70* (2013.01)

(58) Field of Classification Search
USPC ......................................................... 716/55
See application file for complete search history.

(56) References Cited

U.S. PATENT DOCUMENTS

| 7,794,903 B2 | 9/2010 | Sarma et al. |
| 8,640,058 B2 | 1/2014 | Socha |

(Continued)

FOREIGN PATENT DOCUMENTS

| JP | 2007183630 A | 7/2007 |
| JP | 2009053605 A | 3/2009 |

(Continued)

OTHER PUBLICATIONS

International Search Report issued in PCT/JP2013/005193, mail date of Dec. 10, 2013.

(Continued)

*Primary Examiner* — Mohammed Alam
(74) *Attorney, Agent, or Firm* — Rossi, Kimms & McDowell LLP

(57) ABSTRACT

A mask data generating method for generating data of a plurality of masks used in a plurality of exposures in which exposure light is irradiated onto a substrate using a mask, and then exposure light is irradiated onto the substrate using another mask. The method includes the steps of obtaining data for a pattern including a plurality of pattern elements, determining formulation of a disposition limitation condition for the pattern elements, analyzing the distance between the pattern elements, determining formulation of the distance limitation condition, and applying a first variable configured to express a number of pattern divisions and a second variable configured to express a distance related to all pattern elements in a cost function and thereby dividing the pattern.

9 Claims, 3 Drawing Sheets

(56) References Cited

U.S. PATENT DOCUMENTS

| | | |
|---|---|---|
| 8,819,601 B2 | 8/2014 | Chen et al. |
| 2007/0031740 A1 | 2/2007 | Chen et al. |
| 2009/0061362 A1 | 3/2009 | Taoka et al. |
| 2009/0217224 A1 | 8/2009 | Wiaux et al. |
| 2011/0078638 A1 | 3/2011 | Kahng et al. |

FOREIGN PATENT DOCUMENTS

| | | |
|---|---|---|
| JP | 2009200499 A | 9/2009 |
| JP | 2010123943 A | 6/2010 |
| JP | 2012220955 A | 11/2012 |
| NL | 2003707 A | 5/2010 |
| TW | 200919549 A | 5/2009 |
| TW | 360021 B | 3/2012 |

OTHER PUBLICATIONS

Taiwanese Office Action issued in Taiwanese counterpart application No. TW102131981, dated Feb. 25, 2015. English translation provided.

A.    B.

MASK PATTERN GENERATING METHOD, STORAGE MEDIUM, INFORMATION PROCESSING APPARATUS FOR EXECUTION OF THE SAME, MASK MANUFACTURING METHOD AND DEVICE MANUFACTURING METHOD

TECHNICAL FIELD

The present disclosure relates to a mask data generating method, a program and an information processing apparatus for execution of the same.

BACKGROUND ART

An exposure apparatus is used in a lithograph step of the process for manufacturing a semiconductor device. The lithograph step is a step in which a circuit pattern of a semiconductor device is transferred onto a substrate (silicon substrate, glass substrate, wafer, or the like). The exposure apparatus illuminates a mask (reticle) with an illumination optical system by use of light from a light source, and thereby transfers the circuit pattern formed on the mask through a projection optical system or the like onto the wafer. In recent years, due to the developments in pattern miniaturization for a semiconductor device, the wafer is exposed on a plurality of occasions by use of a plurality of masks to thereby execute a plurality of exposure operations to form a corresponding plurality of mask patterns on a single layer on the wafer. Generally, the resolution limit of the exposure apparatus is expressed by $hp=k_1 \times \lambda/NA$. The denotation hp is an abbreviation for half pitch, and is half the shortest distance between adjacent patterns. The denotation $k_1$ is the process factor, $\lambda$ is the exposure light wavelength, and NA is the numerical aperture of the exposure apparatus. The plurality of exposure operations is a technique of dividing and exposing the pattern, that has a smaller half pitch than the half pitch of the resolution limit of the exposure apparatus, into a plurality of mask patterns to thereby enable the resolution of a more detailed pattern than the resolution limit that does not impart a sufficient exposure margin with a single conventional exposure.

The method of dividing a single layout (pattern) into a plurality of mask patterns includes a characteristic such as divided coating of color which is generally termed a coloring problem. The feature of pattern division may use an expression such as divided color coating. A method of dividing an original target pattern into a plurality of mask patterns includes the method disclosed in Patent Literature 1 that applies a division rule by use of an iterative method. More specifically, this method determines a division rule, and attributes a mask as a first mask or attributes a mask as a second mask by application of the division rule to the pattern under consideration, and then repeats that operation for each pattern. Furthermore, Patent Literature 2 discloses a pattern division method using a conflict graph and a method of mathematical programming. A conflict graph is a graph that is configured from points and sides, and in the example of pattern division, each mask pattern is expressed by points, and patterns that exceed the resolution limit are connected by a side. Pattern division is calculated using a method of mathematical programming so that the mask number of both sides is a different number.

CITATION LIST

Patent Literature

Patent Document 1: United States Patent Application No. 2007/0031740

Patent Document 2: United States Patent Application No. 2011/0078638

In this regard, manufacturing costs of the mask are suppressed by reducing the number of mask pattern divisions, and lithography friendly pattern division has been proposed in which the process factor $k_1$ is increased. More specifically, it is preferred that the minimum distance between divided patterns is maximized. However, the method disclosed in Patent Literature 1 only proposes a mask pattern division, and does not propose that the minimum distance between divided patterns is maximized. Furthermore, the method disclosed in Patent Literature 2 considers examination of the overlap length of the pattern in view of stitching, but also does not propose the point that the minimum distance between divided patterns is maximized.

SUMMARY OF INVENTION

The present disclosure is proposed in light of the above circumstances and, for example, and provides a lithography friendly mask data generating method in which the number of mask pattern divisions is reduced and the minimum distance between pattern elements of the divided pattern is maximized.

The present disclosure is a mask data generating method for generating data of a plurality of masks used in a plurality of exposures in which exposure light is irradiated onto a substrate using a mask, and then exposure light is irradiated onto the substrate using another mask. The method includes the steps of obtaining data for a pattern including a plurality of pattern elements, determining formulation of a disposition limitation condition for the pattern elements, analyzing the distance between the pattern elements, determining formulation of the distance limitation condition, and applying a first variable configured to express a number of pattern divisions and a second variable configured to express a distance related to all pattern elements in a cost function and thereby dividing the pattern.

Further features of the present invention will become apparent from the following description of exemplary embodiments with reference to the attached drawings.

DESCRIPTION OF EMBODIMENTS

The embodiments for executing the present disclosure will be described below making reference to the figures. The present disclosure is applied when generating pattern data for a mask (original) used in a micromechanism or manufacture of various types of devices such as an imaging element, or the like such as a CCD, a detection element such as a magnetic head, or the like, a display element such as a liquid panel, or the like, or a semiconductor chip such as an IC, LSI, or the like.

Figure 1:
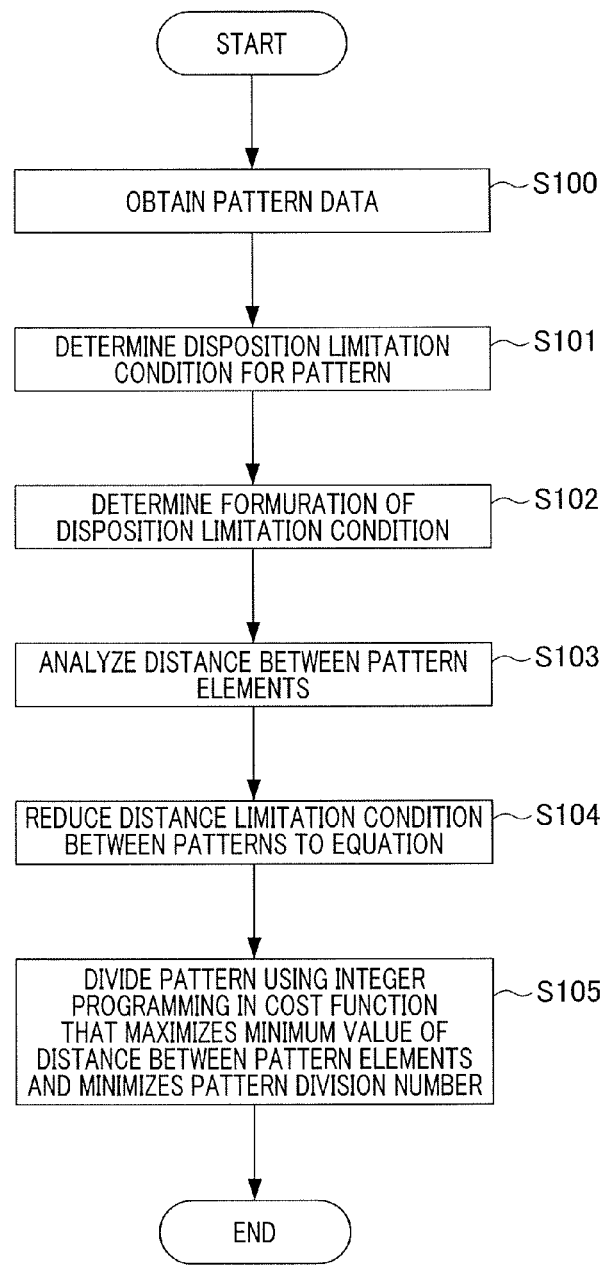
FIG. 1 is a flowchart illustrating the flow of generation of mask data according to one embodiment.
Figure 2A:
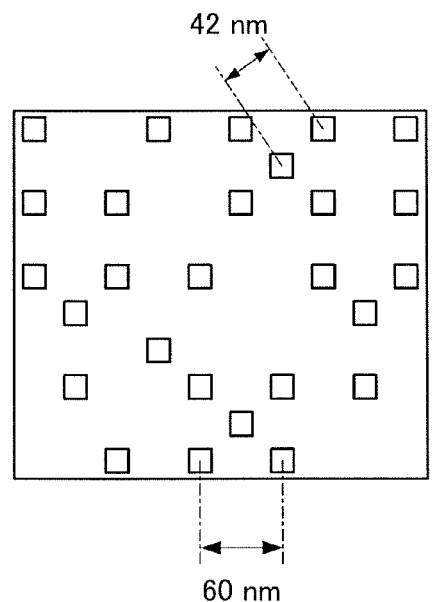
FIG. 2A illustrates a mask pattern before division.
Figure 2B:
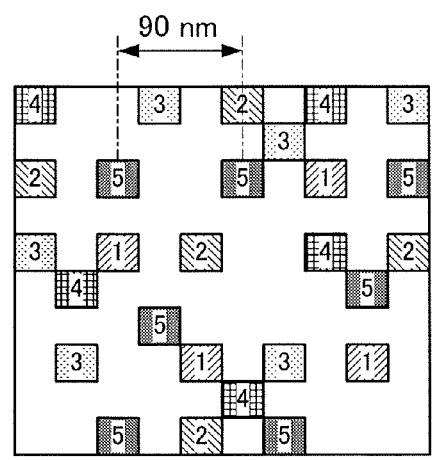
FIG. 2B illustrates a mask pattern after division according to a conventional technique.
Figure 2C:
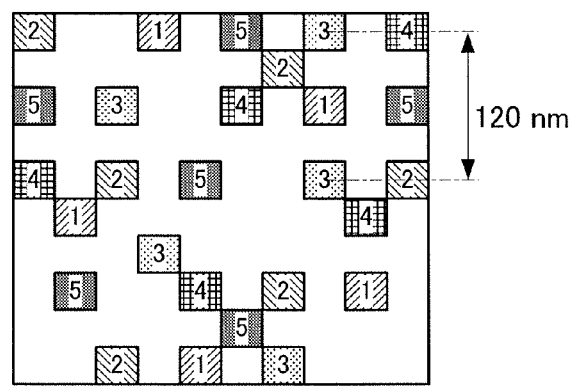
FIG. 2C illustrates a mask pattern after division according to one embodiment.
Figure 3:
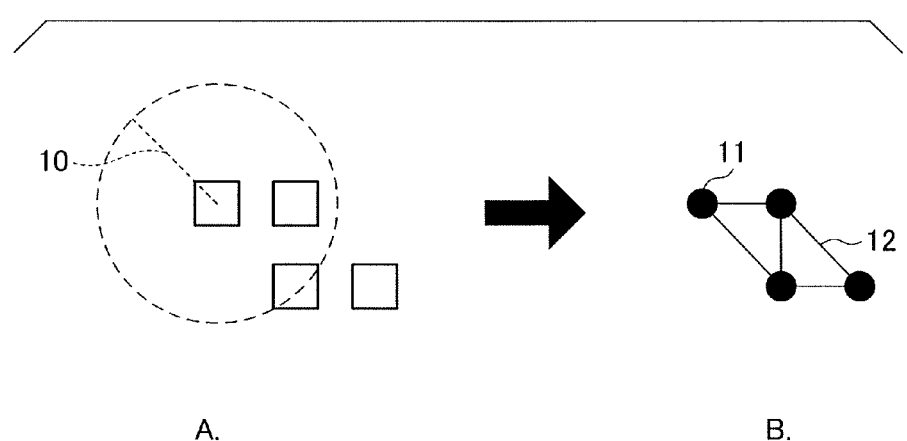
FIG. 3 illustrates a sequence of preparing a conflict graph.

A mask data generating method according to one exemplary embodiment of the present disclosure will be described. FIG. 1 illustrates a flowchart illustrating the flow of generation of mask data according to one exemplary embodiment. The generating method according to the present exemplary embodiment is executed by an information processing apparatus such as a computer, to thereby generate mask data used in an exposure apparatus configured to expose a mask pattern image on a substrate. Firstly, the computer obtains pattern data for the object to be divided (step S100). FIGS. 2A to 2C illustrate a mask pattern before division and after division. In particular, FIG. 2A illustrates a pattern for an object to be divided (before division). In this manner, the pattern of the object to be divided is provided for example in a polygonal coordinate format. Next, the computer determines the disposition limitation conditions for the pattern (step S101). FIG. 3 is a schematic figure that illustrates a sequence of preparing a conflict graph by use of the polygonal data. As used herein, the term "disposition limitation conditions for the pattern", as illustrated in the left figure of FIG. 3 denotes the feature in which a distance 10 between central positions of individual patterns is defined, and when the distance 10 is within a predetermined distance, the conditions must be denoted by different mask numbers. The mask numbers are the individual numbers that correspond to respective masks such as 1, 2, 3, or the like, and may be referred to as color numbers in relation to the coloring problem. Furthermore, the division into different mask numbers is termed coating division in the coloring problem. The right figure of FIG. 3 illustrates a conflict graph that that is prepared by denoting the pattern as the points 11, connecting the patterns within the predetermined distance by use of the line segments 12, and dividing both ends of the points 11 connected by the line segments 12 into different mask numbers. Next, the computer executes determining formulation of the disposition limitation condition by stating the disposition limitation condition determined in the step S101 as an integer problem (step S102). Next, the computer analyzes the distance between the pattern elements (step S103). Then, the computer executes determining formulation of the limitation conditions by stating the limitation conditions for the distance between the pattern elements as an integer problem (step S104). The computer minimizes the number of divisions of the mask pattern and uses a cost function that maximizes the minimum value for the distance between pattern elements to thereby divide the mask pattern using a mathematical programming method (step S105), and thereby completes generation of the mask data corresponding to each mask.

In step S105, solver software called ILOG CPLEX (registered trademark) of the IBM Corporation for example is used to realize the mathematical programming method. When using the software, the reduction to an equation executed in the steps S102 and S104 are stated in a 1p file. The equation for the integer problem used in the steps S102 and S104 when solving by use of a mathematical programming method will be described below.

Firstly, the various types of variables will be described. The variable j ($1 \leq j \leq m$) is the mask number. The variable m denotes the maximum mask number. The variable $y_j$ denotes a binary variable that expresses whether or not the mask number j is used, and takes a value of 1 when the mask number j is used and a value of 0 when the mask number j is not used. The variable i denotes the number of the pattern element (the mask pattern number). The variable $x_{ij}$ denotes a binary variable that expresses whether or not the mask number j is used in relation to the number i of the pattern element, and takes a value of 1 when the mask number j is used and a value of 0 when the mask number j is not used. $P_{all}$ denotes the minimum value of the distance between patterns for all mask numbers. $P_j$ denotes the minimum value of the distance between patterns in relation to the j-th mask number. $D_{ii'j}$ denotes a binary variable that takes a value of 1 when both of the i-th pattern and the i'-th pattern use the j-th mask, and when this is not the case, takes a value of 0.

Next, various types of constants will be described. The constant pitch$_{ii'}$ denotes the interval between the i-th pattern element and the i'-th pattern element. The constant α denotes a weighting for the cost function for the number of the mask numbers (color number). The constant β denotes a weighting for the cost function for the distance between pattern elements for all masks. The constant γ denotes a weighting for the cost function for the distance between pattern elements for the j-th mask.

Next, the various types of equations will be described. The cost function (objective function) is expressed in a polynomial form as illustrated in Equation 1.

$$\text{minimize } \alpha * \sum_{j=1}^{m} y_j + \beta * P_{all} + \gamma * \sum_{j=1}^{m} P_j \quad \text{[Equation 1]}$$

The coefficient α is a positive constant, and the coefficients β and γ are negative constants. Furthermore, Equation 1 expresses that the number of used mask numbers is minimized, and the minimum value of the distance between pattern elements is maximized. Furthermore, the first term in Equation 1 expresses the number of mask numbers, and the second term and third term express the minimum value of the distance between pattern elements for the same mask number. In addition, the portion (first variable) that is not multiplied by α in the first term in Equation 1 is expressed by Equation 2.

$$\sum_{j=1}^{m} y_j \quad \text{[Equation 2]}$$

Equation 2 is equal to the number of mask numbers, and for example, when the number of mask numbers is increased by a value of 1 from 2 to 3, the value of Equation 2 also increases from 2 to 3. On the other hand, since $P_{all}$ (second variable) expresses the minimum value (nm) of the distance between divided patterns, when the minimum value of the distance between pattern elements of the divided pattern is reduced by a value of 1 nm, $P_{all}$ is reduced by a value of one. Since the generation of the mask data according to the present embodiment includes division of the mask pattern by the lowest number of mask numbers, and increasing (maximizing) the distance between pattern elements to the greatest degree possible, the weighting in the first term of Equation 1 must be made as large as possible. That is to say, the absolute value of α must be sufficiently large in comparison to the absolute value of β and γ. For example, when α=1, it is preferred that β takes a value of approximately −0.001. This is due to the fact that since the value of $P_{all}$ is approximately 100 when pattern splitting must be executed, the weighting of the first term will be larger than the weighting on the second term irrespective of the substantial value taken by Equation 2 or $P_{all}$. Furthermore, the third term in Equation 1 is a term for maximizing the minimum value of the distance between pattern elements for individual mask numbers after maximizing the distance between patterns for all mask numbers. At this time, the weighting for the third term should be smaller than the weighting for the second term, and for example, when β=−0.001, a value of approximately γ=−0.00001 may be taken. The third term may not be a required term in light of generation of lithography friendly mask data.

On the other hand, the optimal cost function may be written as maximizing the number of mask numbers that are used. In this case, the cost function is expressed by Equation 3, wherein α is a negative constant, and β and γ are both positive constants.

$$\text{maximize } \alpha * \sum_{j=1}^{m} y_j + \beta * P_{all} + \gamma * \sum_{j=1}^{m} P_j \qquad \text{[Equation 3]}$$

Next, the various types of disposition limitation conditions will be described. These disposition limitation conditions are expressed by the following equations.

$$y_1 \geq y_2 \geq \ldots \geq y_m \qquad \text{[Equation 4]}$$

$$\sum_{j=1}^{m} x_{ij} = 1 \ (\forall\, i) \qquad \text{[Equation 5]}$$

$$x_{ij} \leq y_j \ (\forall\, i, \forall\, j) \qquad \text{[Equation 6]}$$

$$x_{ij} + x_{i'j} \leq 1 \ (\forall\, j) \qquad \text{[Equation 7]}$$

$$x_{ij} + x_{i'j} \geq 2 * D_{ii'j} \ (\forall\, j) \qquad \text{[Equation 8]}$$

$$x_{ij} + x_{i'j} \leq 1 + D_{ii'j} \ (\forall\, j) \qquad \text{[Equation 9]}$$

$$P_j - \text{pitch}_{ii'} * D_{ii'j} - 500(1 - D_{ii'j}) \leq 0 \ (\forall\, j) \qquad \text{[Equation 10]}$$

$$P_j \geq P_{all} \ (\forall\, j) \qquad \text{[Equation 11]}$$

Firstly, the equation used in step S102 of the equations related to the limitation conditions above will be described. Equation 4 expresses a limitation condition for use in relation to a sequence of mask numbers in ascending order. For example, notwithstanding the fact that $y_1=0$, that is to say, the first mask number is not used, the equation is such that $y_2=1$, that is to say, the second mask number is not used. Equation 5 expresses limitation conditions such that only one mask number is used in relation to the flag $x_i$ of the i-th mask pattern. For example, the first mask number and the second mask number are not used in relation to the i-th pattern. Equation 6 expresses limitation conditions such that division is not allowable in relation to mask numbers that are not used. For example, notwithstanding the fact that the j-th mask number is not used, that is to say $y_j=0$, the configuration avoids a situation in which the j-th mask number is used in the i-th pattern, that is to say, so that $x_{ij}$ does not equal 1. Equation 7 expresses a limitation condition for a pattern based on the conflict graph, and is applied when the i-th pattern is connected to the i'-th pattern by a line segment, that is to say, when the same mask number cannot be used.

Next, the equation that is used in step S104 of the limitation condition equations above will be described. Equation 8 and Equation 9 denote the $D_{ii'j}$ limitation condition, in which when both $x_{ij}$ and $x_{i'j}$ take a value of 1, $D_{ii'j}=1$, and when at least one of $x_{ij}$ and $x_{i'j}$ take a value of 0, $D_{ii'j}=0$. That is to say, $D_{ii'j}$ denotes the logical multiplication of $x_{ij}$ and $x_{i'j}$. Equation 10 is such that $P_j \leq \text{pitch}_{ii'}$ when $D_{ii'j}=0$, and is the limitation condition that expresses that the value of Pj is less than or equal to the value of the distance between pattern elements. On the other hand, according to Equation 10, when $D_{ii'j}=0$, $P_j \leq 500$. The value for 500 is set in consideration of the fact that normally when $D_{ii'j}=0$, there is no substantial limitation in relation to Pj. Therefore, although a value of 500 is deemed herein to be a value that is sufficiently larger than the distance between pattern elements, another value, for example a value of even 1000 may be used to for the same meaning in relation to that equation. Equation 8 to Equation 10 do not require input of all the distances between the pattern elements, and for example, a distance to be excluded from the limitation conditions such as a distance in which $k_1>1.0$ may be ignored, and thereby the calculation speed may be enhanced. Furthermore, Equation 11 is a limitation condition that expresses that $P_{all}$ all is the minimum value for Pj.

Next, the various types of boundary conditions will be described. These limitation conditions are expressed in the following equations.

$$y_1=1 \qquad \text{[Equation 12]}$$

$$P_j \geq 0 (\forall\, j) \qquad \text{[Equation 13]}$$

$$P_{all} \geq 0 \qquad \text{[Equation 14]}$$

Equation 12 is the equation used in step S102, and is the boundary condition that expresses use of the 1-th mask number. Equation 13 and Equation 14 are both used in step S104. Equation 13 is the boundary condition that expresses that the distance of each mask number is a value that is greater than 0. Equation 14 is the boundary condition that expresses that the minimum value of the distance between pattern elements is a value greater than 0.

Furthermore, the variables used in both step S102 and S104 are expressed by the following equations. The variables expressed by Equation 15 to Equation 17 below are all binary variables and fluctuate in the range {0, 1}.

$$y_j \qquad \text{[Equation 15]}$$

$$x_{ij}(\forall\, i, \forall\, j) \qquad \text{[Equation 16]}$$

$$D_{ii'j}(\forall\, j) \qquad \text{[Equation 17]}$$

When using the above software, the number of divisions in the mask pattern can be minimized by input of a 1p file that is prepared based on the above equations, and thereby division of the mask pattern is possible with the minimum value of the distance between pattern elements maximized. An actual example will be described below. FIG. 2B illustrates map data for the pattern illustrated in FIG. 2A when a mask pattern division is performed that does not consider the minimum value between the pattern distances. FIG. 2C applies the mask data generating method according to the present exemplary embodiment and illustrates map data in relation to the pattern illustrated in FIG. 2A when a mask pattern division is performed that considers the minimum value between the pattern distances. The numbers stated in FIG. 2B and FIG. 2C are the divided mask numbers. The pattern prior to division illustrated in FIG. 2A includes a grid in the x direction and the y direction that has a 30 nm pitch, and the minimum value of the distance between pattern elements is 42 nm. This pattern is subjected to pattern division so that a pattern within 85 nm has a different mask number. Firstly, as shown by the conventional configuration, when the minimum value between the pattern elements is not considered, as illustrated in FIG. 2B, the minimum value for the distance between the pattern elements is 90 nm, and the number of mask pattern divisions is 5. In contrast, when the minimum value between the pattern elements is considered, as illustrated in FIG. 2C, the minimum value for the distance between the pattern elements is 120 nm, and the number of mask pattern divisions is 5. Therefore, for example, when using an example of an immersion exposure apparatus in which NA=1.35, and λ=193.368 nm, there is an improvement from $k_1$=0.31 to $k_1$=0.41, and even when using the same number of mask divisions, generation of more lithography friendly mask data is enabled.

As described above, the present exemplary embodiment provides a lithography friendly mask data generating method that maximizes the minimum value of the distance between pattern elements of the divided pattern and reduces the number of mask pattern divisions. The mask data generating method according to the present exemplary embodiment uses an integer programming. However, another optimization method may be used as long as it is a method that simultaneously expresses a first variable that denotes the mask division number and a second variable that denotes the minimum value for distances between common pattern elements as a cost function. For example, in substitution for the integer programming, a method such as a genetic algorithm or a mixed integer programming may be used.

The present disclosure may be realized by execution of the following processing steps. That is to say, the software (program) that realizes the functions in the above exemplary embodiment is supplied to a system or an apparatus through various types of storage media, and the computer (information processing apparatus) of the system or the apparatus performs processing by reading and executing the program.

A mask drawing apparatus manufactures a plurality of masks by inputting mask data generated by use of the generating method according to the above exemplary embodiment into the mask drawing apparatus. The manufactured masks are mounted onto a mask stage in the exposure apparatus, and illuminated by an illumination optical system to thereby expose an image of a pattern on the mask onto a wafer. After exposing the wafer using one mask of the manufactured masks, wafer exposure is executed using another mask in relation to the same layer of the wafer, and thereby it is possible to form a pattern on one layer on the wafer using a plurality of exposure operations.

Next, a manufacturing method for a device (liquid crystal display device or the like) will be described. The liquid crystal display device is manufactured using a process of forming a transparent electrode. The process of forming a transparent electrode includes a step of applying a photosensitive agent onto a glass substrate that is subjected to vapor deposition of a transparent conductive film, a step of exposing the glass substrate that is coated with the photosensitive agent after mounting of a mask manufactured as described above in an exposure apparatus, and a step of developing the glass substrate. The device manufacturing method using the exposure apparatus as described above is applicable to the manufacture of a device such as a semiconductor device for example, in addition to a liquid crystal display device. The above method may includes a step of mounting a mask manufactured as described above in an exposure apparatus and exposing a substrate that is coated with the photosensitive agent, and a step of developing the exposed substrate. Furthermore, the method of manufacture of a device may include other known steps (oxidation, film deposition, vapor deposition, doping, flattening, etching, resist peeling, dicing, bonding, and packaging, or the like).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-195820 filed Sep. 6, 2012, which is hereby incorporated by reference herein in its entirety.

The invention claimed is:

1. A mask pattern generating method for generating patterns of a plurality of masks used for a mask manufacturing method for manufacturing the plurality of masks using data of the generated patterns of the plurality of masks used in a plurality of exposures in which exposure light is irradiated onto a substrate using a mask, and then exposure light is irradiated onto the substrate using another mask, the mask pattern generating method comprising the following steps executed by a computer:
   obtaining data for a pattern including a plurality of pattern elements,
   determining formulation of a disposition limitation condition for the pattern elements,
   analyzing the distance between the pattern elements,
   determining formulation of the distance limitation condition, and
   applying a first variable configured to express a number of pattern divisions and a second variable configured to express a distance related to all pattern elements in a cost function and thereby dividing the pattern,
   wherein the mask manufacturing method comprises a step of manufacturing the plurality of masks including the divided pattern using data of the divided pattern.

2. The method according to claim 1, wherein a minimum value of the distances related to a plurality of the patterns is used as the cost function.

3. The method according to claim 1, wherein the disposition limitation condition, the distance limitation condition and the cost function are stated as an integer problem, and in the dividing the pattern, an integer programming or a mixed integer programming is used.

4. The method according to claim 1, wherein the coefficient multiplied by the first variable is a positive constant, the coefficient multiplied by the second variable is a negative constant, the cost function is expressed as a polynomial that includes the above two terms and the pattern is divided by minimizing the cost function.

5. The method according to claim 1, wherein the coefficient multiplied by the first variable is a negative constant, the coefficient multiplied by the second variable is a positive constant, the cost function is expressed as a polynomial that includes the above two terms and the pattern is divided by maximizing the cost function.

6. A non-transitory storage medium storing a computer program, wherein the computer program causes the computer to execute a mask pattern generating method or generating patterns of a plurality of masks used for a mask manufacturing method for manufacturing the plurality of masks using data of the generated patterns of the plurality of masks used in a plurality of exposures in which exposure light is irradiated onto a substrate using a mask, and then exposure light is irradiated onto the substrate using another mask, the mask pattern generating method comprising the following steps executed by a computer:
   obtaining data for a pattern including a plurality of pattern elements,
   determining formulation of a disposition limitation condition for the pattern elements,
   analyzing the distance between the pattern elements,
   determining formulation of the distance limitation condition, and applying a first variable configured to express a number of pattern divisions and a second variable configured to express a distance related to all pattern elements in a cost function and thereby dividing the pattern, wherein the mask manufacturing method comprises a step of manufacturing the plurality of masks including the divided pattern using data of the divided pattern.

7. An information processing apparatus configured to execute a mask pattern generating method for generating patterns of a plurality of masks used for a mask manufacturing method for manufacturing the mask using data of the generated patterns of the plurality of masks used in a plurality of exposures in which exposure light is irradiated onto a substrate using a mask, and then exposure light is irradiated onto the substrate using another mask, the mask pattern generating method comprising the following steps executed by a computer:

obtaining data for a pattern including a plurality of pattern elements, determining formulation of a disposition limitation condition for the pattern elements, analyzing the distance between the pattern elements, determining formulation of the distance limitation condition, and applying a first variable configured to express a number of pattern divisions and a second variable configured to express a distance related to all pattern elements in a cost function and thereby dividing the pattern.

8. A mask manufacturing method, the method comprising:

generating patterns of a plurality of masks using a mask pattern generating method for generating patterns of a plurality of masks used in a plurality of exposures in which exposure light is irradiated onto a substrate using a mask, and then exposure light is irradiated onto the substrate using another mask, the mask pattern generating method comprising the following steps executed by a computer:

obtaining data for a pattern including a plurality of pattern elements, determining formulation of a disposition limitation condition for the pattern elements, analyzing the distance between the pattern elements, determining formulation of the distance limitation condition, applying a first variable configured to express a number of pattern divisions and a second variable configured to express a distance related to all pattern elements in a cost function and thereby dividing the pattern, and manufacturing the plurality of masks including the divided pattern using data of the divided pattern.

9. A method for manufacturing a device, the method comprising:

transferring a pattern of a plurality of mask manufactured by a mask manufacturing method, onto a substrate by use of the exposure apparatus, and developing the substrate after transfer, wherein the mask manufacturing method comprises:

generating patterns of a plurality of masks using a mask pattern generating method for generating patterns of a plurality of masks used in a plurality of exposures in which exposure light is irradiated onto a substrate using a mask, and then exposure light is irradiated onto the substrate using another mask, the mask pattern generating method comprising the following steps executed by a computer:

obtaining data for a pattern including a plurality of pattern elements, determining formulation of a disposition limitation condition for the pattern elements, analyzing the distance between the pattern elements, determining formulation of the distance limitation condition, applying a first variable configured to express a number of pattern divisions and a second variable configured to express a distance related to all pattern elements in a cost function and thereby dividing the pattern, and manufacturing the plurality of masks including the divided pattern using data of the divided pattern.

* * * * *